(12) United States Patent
Masuda et al.

(10) Patent No.: US 9,791,512 B2
(45) Date of Patent: Oct. 17, 2017

(54) TEST APPARATUS, TEST METHOD, CALIBRATION DEVICE, AND CALIBRATION METHOD

(71) Applicant: ADVANTEST CORPORATION, Tokyo (JP)

(72) Inventors: Shin Masuda, Miyagi (JP); Hideo Hara, Miyagi (JP); Tsuyoshi Ataka, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 257 days.

(21) Appl. No.: 14/633,148

(22) Filed: Feb. 27, 2015

(65) Prior Publication Data

US 2015/0253388 A1   Sep. 10, 2015

(30) Foreign Application Priority Data

Mar. 6, 2014 (JP) ................................ 2014-044152

(51) Int. Cl.
*G01R 31/26* (2014.01)
*G01R 31/319* (2006.01)
(Continued)

(52) U.S. Cl.
CPC ... *G01R 31/31917* (2013.01); *G01R 31/3163* (2013.01); *G01R 31/3191* (2013.01); *G01R 31/31713* (2013.01); *G01R 31/31901* (2013.01)

(58) Field of Classification Search
CPC .............. G01R 31/311; G01R 31/2886; G01R 31/2889; G01R 31/2882; G01R 31/3025;
(Continued)

(56) References Cited

U.S. PATENT DOCUMENTS 6,676,304 B1 * 1/2004 Coin ...................... G01M 11/33
356/433
6,977,720 B2 * 12/2005 Baney .................. G01M 11/331
356/73.1
(Continued)

FOREIGN PATENT DOCUMENTS

JP   S60-31283 A   2/1985
JP   S60-57273 A   4/1985
(Continued)

OTHER PUBLICATIONS

Notice of Office Action for Japanese Patent Application No. 2014-044152, issued by the Japan Patent Office dated Feb. 23, 2016.
(Continued)

*Primary Examiner* — Minh N Tang

(57) ABSTRACT

Provided is a test apparatus including an optical test signal generating section that generates an optical test signal; an optical signal supplying section that supplies the optical test signal to a device under test that is a testing target among a plurality of the devices under test; a first optical switch section that selects, from among optical signals output by the plurality of devices under test, the optical signal output by the device under test that is the testing target; and an optical signal receiving section that receives the selected optical signal.

16 Claims, 5 Drawing Sheets

(51) Int. Cl.
*G01R 31/3163* (2006.01)
*G01R 31/317* (2006.01)

(58) Field of Classification Search
CPC . H04B 10/801; H04B 10/0731; H01S 5/0057; H01S 5/0427; H01S 5/06821; H01S 5/4006; H01S 3/0064
See application file for complete search history.

(56) References Cited

U.S. PATENT DOCUMENTS

| | | | |
|---|---|---|---|
| 7,321,736 B2 * | 1/2008 | Akiyama | H04B 10/25133 398/213 |
| 7,434,118 B2 | 10/2008 | Moessinger et al. | |
| 8,390,307 B2 | 3/2013 | Slupsky et al. | |
| 2006/0184332 A1 | 8/2006 | Ishida et al. | |
| 2007/0245187 A1 | 10/2007 | Ono | |
| 2008/0118202 A1 | 5/2008 | Kato et al. | |
| 2008/0304608 A1 | 12/2008 | Ishida | |
| 2011/0279109 A1 | 11/2011 | Masuda | |
| 2014/0036349 A1 | 2/2014 | Tokuhisa et al. | |

FOREIGN PATENT DOCUMENTS

| | | |
|---|---|---|
| JP | S63-179265 A | 7/1988 |
| JP | H01-140241 A | 6/1989 |
| JP | 2006-105636 A | 4/2006 |
| JP | 2006-220660 A | 8/2006 |
| JP | 2010-185790 A | 8/2010 |
| WO | 2007/013128 A1 | 2/2007 |

OTHER PUBLICATIONS

Ian A. Young, et al., "Optical I/O Technology for Tera-Scale Computing", IEEE Journal of Solid-State Circuits, Jan. 2010, vol. 45, No. 1, pp. 235-248.
Office Action issued for counterpart Japanese Application 2014-044152, issued by Japan Patent Office dated Aug. 9, 2016.
Office Action issued for counterpart Taiwanese Application 104106079, issued by the Taiwan Intellectual Property Office dated Oct. 24, 2016.
Office Action issued for counterpart Taiwanese Application 104106079, issued by the Taiwan Intellectual Property Office dated Apr. 28, 2017.
Office Action issued for counterpart Korean Application 10-2015-0025419, issued by the Korean Intellectual Property Office dated Jun. 8, 2017.

* cited by examiner

TEST APPARATUS, TEST METHOD, CALIBRATION DEVICE, AND CALIBRATION METHOD

The contents of the following Japanese patent application(s) are incorporated herein by reference: 2014-044152 filed in JP on Mar. 6, 2014.

BACKGROUND

1. Technical Field

The present invention relates to a test apparatus, a test method, a calibration device, and a calibration method.

2. Related Art

Conventionally, a test apparatus for testing a device under test such as a CPU or memory includes an optical interface or the like, and tests a device under test that includes an optical interface, as shown in Patent Documents 1 and 2 and the Non-Patent Document, for example.

Patent Document 1: Japanese Patent Application Publication No. 2006-220660

Patent Document 2: International Publication WO 2007-013128

Non-Patent Document: Ian A. Young, et al., "Optical I/O Technology for Tera-Scale Computing", IEEE Journal of Solid-State Circuits, January 2010, Vol. 45, No. 1, pp. 235-248

To test such a device under test including an optical interface, an optical signal is output to the device under test and an optical response signal corresponding to the optical signal is detected, and therefore it is necessary to include a photometric unit or the like for optical communication. With such a test apparatus, when testing a plurality of devices under test, a plurality of photometric units are provided to correspond to the plurality of devices under test or the device under test is exchanged every time testing is performed, and this requires significant cost and effort. Furthermore, when testing a device under test that handles both electrical signals and optical signals, it is difficult to separately judge both pass/fail of the connection state of the optical interface handling the optical signal and pass/fail of the device under test 10.

SUMMARY

Therefore, it is an object of an aspect of the innovations herein to provide a test apparatus, a test method, a calibration device, and a calibration method, which are capable of overcoming the above drawbacks accompanying the related art. The above and other objects can be achieved by combinations described in the claims. According to a first aspect of the present invention, provided is a test apparatus including an optical test signal generating section that generates an optical test signal; an optical signal supplying section that supplies the optical test signal to a device under test that is a testing target among a plurality of the devices under test; a first optical switch section that selects, from among optical signals output by the plurality of devices under test, the optical signal output by the device under test that is the testing target; and an optical signal receiving section that receives the selected optical signal. Also provided is a test method.

According to a second aspect of the present invention, provided is a calibration device that calibrates the test apparatus, including an electrical signal transmitting section that receives the electrical test signal supplied from the electrical test signal generating section via the electrical interface, and transmits the received electrical test signal to the electrical signal receiving section via the electrical interface; and an optical signal transmitting section that receives the optical test signal output from the optical test signal generating section via the optical signal supplying section, and transmits the received optical test signal to the optical signal receiving section via the first optical switch section. Also provided is a calibration method.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
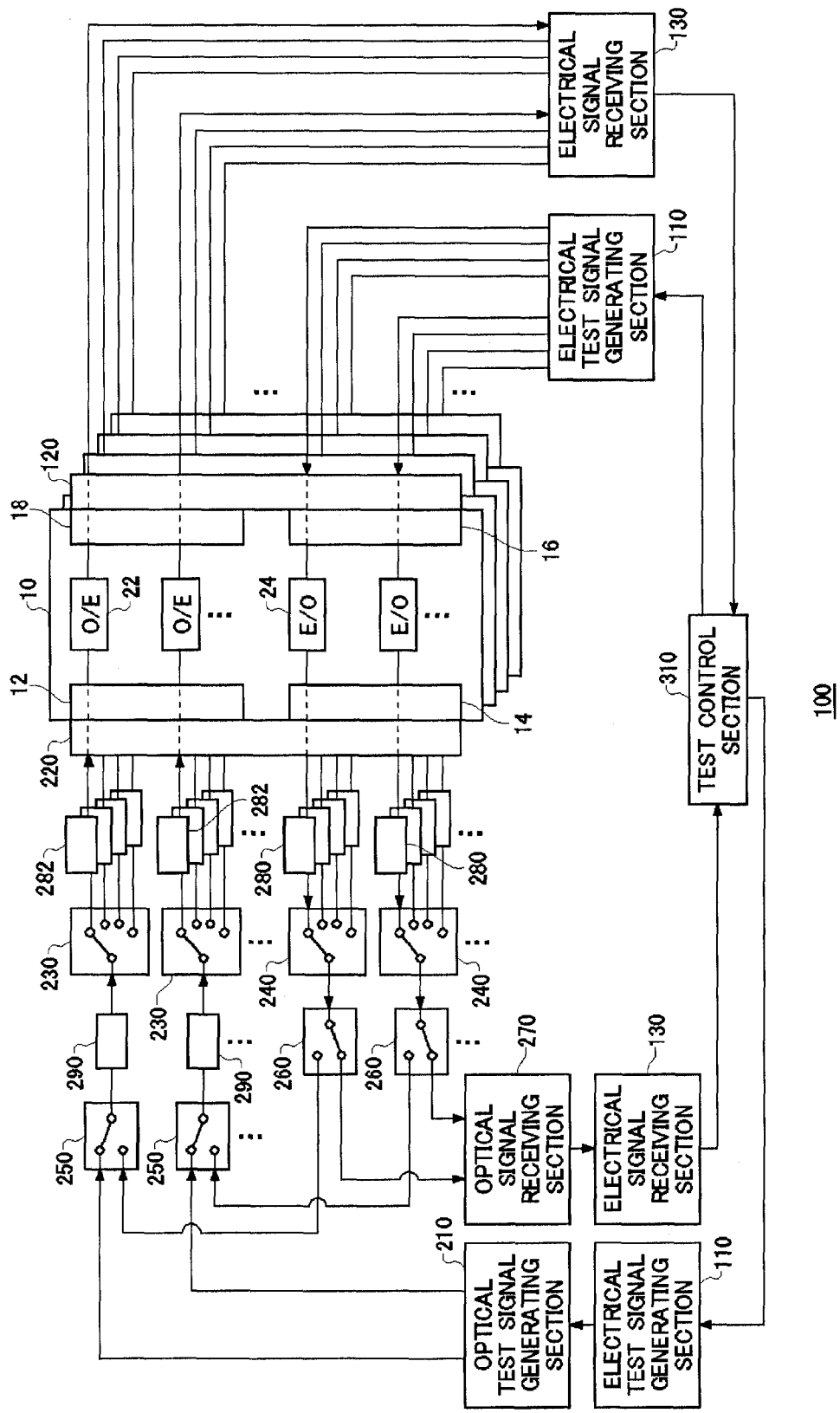
FIG. 1 shows an exemplary configuration of a test apparatus 100 along with a device under test 10.

FIG. 1 shows an exemplary configuration of a test apparatus 100 along with a device under test 10. The test apparatus 100 tests a plurality of devices under test 10 having optical interfaces and including an analog circuit, a digital circuit, a memory, a system on chip (SOC), and the like. Each device under test 10 may be a circuit that is a combination of an optical interface and at least one of an analog circuit, a digital circuit, a memory, a system on chip (SOC), or the like.

The optical interface of the device under test 10 includes one or more optical input sections 12 and one or more optical output sections 14 for handling an optical signal. The optical input section 12 and the optical output section 14 may be connectors that respectively connect one or more optical signals by engaging with each other. The optical input section 12 and the optical output section 14 are each a connector formed by exposing and arranging one end surface of an optical waveguide of an optical fiber, for example. Instead, the optical input section 12 and the optical output section 14 may each include an optical fiber in compliance with Mechanical Transfer (MT), Multiple-Fiber Push-On (MPO), Lucent Connector (LC), Miniature unit (MU), Subscriber Connector (SC), Straight Tip (ST), or Ferrule Connector (FC) types.

The device under test 10 may include an electrical interface that has one or more input terminals 16 and one or more output terminals 18 for exchanging electrical signals. The input terminal 16 and the output terminal 18 may be a plurality of solder bumps arranged in a BGA (Ball Grid Array) or may instead be a plurality of flat electrode pads arranged in an LGA (Land Grid Array).

The input terminal 16 and the output terminal 18 may be one or more solder bumps, one or more lands, and/or one or more connectors. The input terminal 16 and the output terminal 18 may be one or more input terminals 16, one or more output terminals 18, and/or one or more input/output terminals that exchange electrical signals. The present embodiment describes an example in which the device under test 10 includes a plurality of optical input sections 12, optical output sections 14, input terminals 16, and output terminals 18.

The device under test 10 includes a plurality of opto-electrical converting sections 22 (O/E) and a plurality of electro-optical converting sections 24 (E/O). The opto-electrical converting sections 22 convert an optical signal into an electrical signal (O/E conversion). For example, the opto-electrical converting sections 22 convert the optical signal into the electrical signal using a light receiving device such as a photodiode.

The electro-optical converting sections 24 convert an electrical signal into an optical signal (E/O conversion). For example, the electro-optical converting sections 24 drive a light emitting device such as a laser or LED in response to the electrical signal, to convert the electrical signal into the optical signal. Instead, the electro-optical converting sections 24 may include an optical modulation device and modulate the output light of an LED, laser, or the like with the electrical signal to convert the electrical signal into the optical signal. The present embodiment describes an example in which the device under test 10 converts an optical signal, which is input from an optical input section 12, into an electrical signal using a corresponding opto-electrical converting section 22 and outputs the resulting electrical signal from an output terminal 18, and also converts an electrical signal, which is input from an input terminal 16, into an optical signal using an electro-optical converting section 24 and outputs the resulting optical signal from an optical output section 14.

The test apparatus 100 has such a device under test 10 mounted thereon and exchanges optical signals and electrical signals to test the device under test 10. FIG. 1 shows an example in which the test apparatus 100 tests four devices under test 10. The test apparatus 100 includes electrical test signal generating sections 110, electrical interfaces 120, electrical signal receiving sections 130, an optical test signal generating section 210, optical interfaces 220, optical signal supplying sections 230, first optical switch sections 240, second optical switch sections 250, third optical switch sections 260, an optical signal receiving section 270, first detecting sections 280, second detecting sections 282, optical intensity changing sections 290, and a test control section 310.

Each electrical test signal generating section 110 generates an electrical test signal for testing the devices under test 10. For example, the electrical test signal generating section 110 generates an electrical test signal based on test data or the like, which is in turn based on a test sequence or test pattern data designated by a test program. The electrical test signal generating section 110 generates a PRBS (Pseudo-Random Bit Sequence) signal as the electrical test signal, for example.

The electrical interfaces 120 supply each of the devices under test 10 with the electrical test signal, and receive and output the electrical signals output by the devices under test. The electrical interfaces 120 are connected respectively to the electrical interfaces of the devices under test 10, and exchange electrical signals with the devices under test 10.

Each electrical interface 120 includes terminals, probes, cantilevers, membrane bumps, or the like connected directly to the input terminals 16 and the output terminals 18 of the devices under test 10. Furthermore, in a case where the input terminals 16 and/or output terminals 18 are connectors, the electrical interface 120 may include connectors that engage with these connectors. The present embodiment describes an example in which each of a plurality of electrical interfaces 120 is connected to the input terminals 16 and the output terminals 18 of a device under test 10, but instead each electrical interface 120 may include a plurality of interfaces that are connected respectively to the input terminals 16 and the output terminals 18.

The electrical interfaces 120 are connected to an electrical test signal generating section 110, and supply the input terminals 16 of the device under test 10 that is the testing target with the electrical test signal generated by the electrical test signal generating section 110. Furthermore, the electrical interfaces 120 are connected to an electrical signal receiving section 130, receive the electrical signals output from the output terminals 18 by the device under test 10 that is the testing target, and supply these electrical signals to the electrical signal receiving section 130.

The electrical signal receiving section 130 is connected to the electrical interfaces 120 and receives the electrical signals from the device under test 10 that has been supplied by the electrical interfaces 120. The electrical signal receiving section 130 may analyze the received electrical signals and analyze the BER (Bit Error Rate). For example, the electrical test signal generating section 110 and the electrical signal receiving section 130 may form a BERT (BER test apparatus) using a pulse pattern generator and an error analyzer.

One set of the electrical test signal generating section 110 and the electrical signal receiving section 130 may be provided in the test apparatus 100 to correspond to one device under test 10. In this case, one set of the electrical test signal generating section 110 and the electrical signal receiving section 130 may be a semiconductor chip formed by a CMOS or the like. FIG. 1 shows an example in which one set of the electrical test signal generating section 110 and the electrical signal receiving section 130 is formed by one CMOS chip, and the test apparatus 100 is provided with four such chips corresponding to the four devices under test 10.

As described further below, the electrical test signal generating section 110 and the electrical signal receiving section 130 may also be used for optical signal generation and optical signal analysis. FIG. 1 shows an example in which one set of the electrical test signal generating section 110 and the electrical signal receiving section 130 is provided to the test apparatus 100 to correspond to the optical test signal generating section 210 and the optical signal receiving section 270.

The optical test signal generating section 210 generates an optical test signal. For example, the optical test signal generating section 210 generates the optical test signal based on test data or the like, which is in turn based on a test sequence or test pattern data designated by a test program. The optical test signal generating section 210 generates an optical signal pattern based on a PRBS signal as the optical test signal, for example. In this case, the optical test signal generating section 210 is connected to the electrical test signal generating section 110 that generates the PRBS signal and may generate the optical test signal by performing electro-optical conversion on the PRBS signal.

The optical interfaces 220 are connected to the optical interfaces of the devices under test 10, and exchange optical signals with these devices under test 10. For example, the optical interfaces 220 include connectors that engage with the optical input sections 12 and the optical output sections 14 of the devices under test 10, and are connected respectively to the devices under test 10. The present embodiment describes an example in which each optical interface 220 is connected to the optical input sections 12 and the optical output sections 14 of a device under test 10, but instead, each optical interface 220 may include a plurality of interfaces that are connected respectively to the optical input sections 12 and the optical output sections 14.

The optical interfaces 220 are connected to the optical test signal generating section 210, and supply the optical input sections 12 of the device under test 10 that is the testing target with the optical test signal generated by the optical test signal generating section 210. Furthermore, the optical interfaces 220 receive the optical signals output by the optical output sections 14 of the devices under test 10, and transmit these optical signals to the inside of the test apparatus 100.

The optical signal supplying sections 230 are connected to the optical interfaces 220, and supply the optical test signal to the device under test 10 that is the testing target among the plurality of devices under test 10. For example, each optical signal supplying section 230 includes an optical switch that selects the device under test 10 to be the testing target from among the plurality of devices under test 10 and inputs the optical test signal output by the optical test signal generating section 210 into the selected device under test 10. FIG. 1 shows an example in which there are a plurality of optical signal supplying sections 230 that each include a 1×4 (1-input/4-output) optical switch for selecting one device under test to be the testing target from among the four devices under test 10 and supplying the selected device under test with the optical test signal.

Instead, each optical signal supplying section 230 may include an optical coupler that branches the optical test signal output by the optical test signal generating section 210 and inputs a resulting branched optical test signal into the device under test that is the testing target. In this case, each optical signal supplying section 230 may include a 1×1 optical switch that switches whether the optical signal is passed, for each optical coupler branch output.

The first optical switch sections 240 are connected to the optical interfaces 220, select the optical signal output by the device under test 10 that is the testing target from among the optical signals output by the plurality of devices under test 10, and transmit the selected optical signal to the inside of the test apparatus 100. FIG. 1 shows an example in which the first optical switch sections 240 include a plurality of 4×1 optical switches that select the one device under test 10 that is the testing target from among the four devices under test 10 and transmits the optical signal output by this one device under test 10 to the inside of the test apparatus 100.

The second optical switch sections 250 are connected to the optical test signal generating section 210, the optical signal supplying sections 230, and the first optical switch sections 240, and switch whether the optical test signal or the optical signal output by the device under test 10 that is the testing target from the first optical switch section 240 is supplied to the device under test 10 that is the testing target. FIG. 1 shows an example in which the second optical switch sections 250 include a plurality of 2×1 optical switches that select whether the optical signal supplying section 230 is connected to the optical test signal generating section 210 or to the first optical switch section 240.

The third optical switch sections 260 are connected to the first optical switch sections 240, the second optical switch sections 250, and the optical signal receiving section 270, and select whether the optical signal output by the device under test 10 that is the testing target from the first optical switch section 240 is input to the optical signal receiving section 270 or to the second optical switch section 250. FIG. 1 shows an example in which the third optical switch sections 260 include a plurality of 1×2 optical switches that select whether the output of the first optical switch section 240 is connected to the second optical switch section 250 or to the optical signal receiving section 270.

The optical signal receiving section 270 receives the optical signal output by the device under test 10 that is the testing target. Specifically, the optical signal receiving section 270 is connected to the third optical switch sections 260 and is selected by a first optical switch section 240 to receive the optical signal transmitted into the test apparatus 100. The optical signal receiving section 270 receives the optical signal using a light receiving device such as a photodiode, performs opto-electrical conversion on the optical signal, and outputs the resulting electrical signal. The optical signal receiving section 270 may be connected to an electrical signal receiving section 130, and may perform a BER measurement by analyzing the output electrical signal with the electrical signal receiving section 130.

The first detecting sections 280 are connected between the optical interfaces 220 and the first optical switch sections 240, and respectively detect the optical intensity of the optical signals output by the devices under test 10. For example, each first detecting section 280 includes an optical intensity measuring unit that measures the optical intensity of the optical signal and a 1×2 branching coupler that branches the optical signal output from the optical interface 220 into two signals, supplies one of the branched signals to the optical intensity measuring unit, and supplies the other branched signal to the first optical switch section 240.

A plurality of the first detecting sections 280 may be provided to the test apparatus 100 to respectively detect the intensity of the optical signals output from the devices under tests 10 and transmitted to the first optical switch sections 240 through the optical interfaces 220. A first detecting section 280 is described in detail further below.

The second detecting sections 282 are connected between the optical interfaces 220 and the optical signal supplying sections 230, and detect the intensity of the optical signals output from the optical signal supplying sections 230, in the same manner as the first detecting sections 280. A plurality of the second detecting sections 282 may be provided to the test apparatus 100 to respectively detect the intensity of the optical signals output from the optical signal supplying sections 230 and transmitted to the devices under test 10 from the optical interfaces 220.

The optical intensity changing sections 290 are connected between the first optical switch sections 240 and the optical signal supplying sections 230, and change the optical intensity of the optical signals output from the optical signal supplying sections 230 to the devices under test 10. The optical intensity changing sections 290 each include an optical amplifier and/or a variable optical attenuator, for example, set the input optical signal to a predetermined optical intensity or designated optical intensity, and output the resulting optical signal. The test apparatus 100 may include a plurality of optical intensity changing sections 290 that respectively change the intensity of the optical signals transmitted to the device under test 10 that is the testing target.

The test control section 310 performs a test program or the like to control each section, according to the test program.

The test control section 310 is connected to the electrical test signal generating section 110 and the electrical signal receiving sections 130, for example, to cause the generation of the test signal, receive the response signals corresponding to the test signal from the electrical signal receiving sections 130, and output these response signals as test results. In the present embodiment, the test control section 310 may output the BER as the test result.

The test control section 310 is also connected to the optical signal supplying sections 230, the first optical switch sections 240, the second optical switch sections 250, and the third optical switch sections 260 and, in order to perform the test corresponding to the test program, switches each connection according to the testing. For example, the test control section 310 switches the connection of each section such that the test signal is supplied to the device under test 10 that is the testing target, according to the test program, from among the plurality of devices under test 10.

The test control section 310 is also connected to the first detecting sections 280 and the second detecting sections 282, and may determine whether each optical signal is normal based on whether the optical intensity of the optical signal detected by the corresponding detecting section is within a predetermined optical intensity range. The test control section 310 is also connected to the optical intensity changing sections 290 and may change the intensity of the optical test signals supplied to the devices under test 10, according to the test program. Furthermore, the test control section 310 may change the intensity of the optical test signal to be supplied to the devices under test 10 by designating this intensity in the optical intensity changing section 290, according to the optical intensity of the optical signals detected by the detecting sections.

The test apparatus 100 of the present embodiment described above performs testing of a plurality of devices under test including optical interfaces, according to a test program. The following describes the execution of the testing, using an operational flow of the test apparatus 100.

Figure 2:
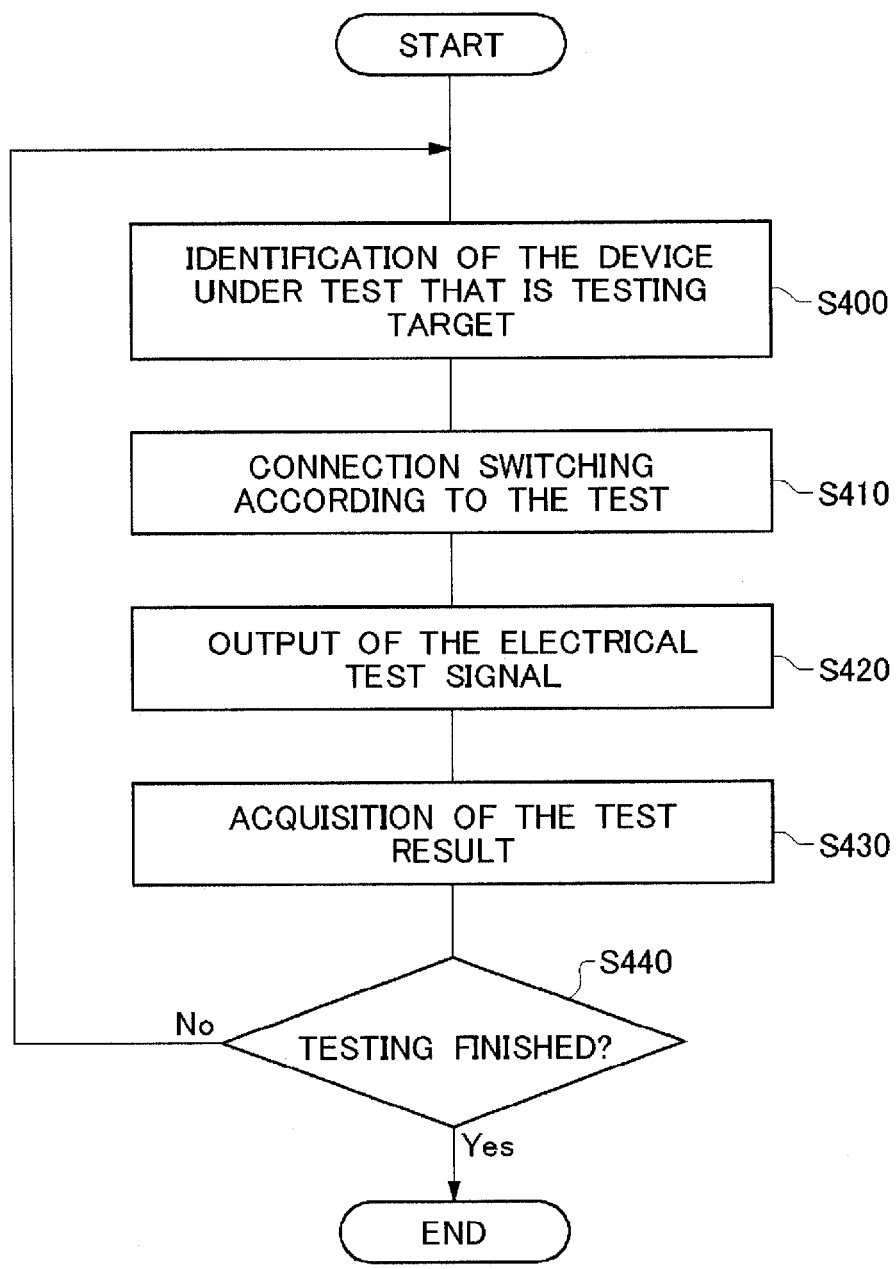
FIG. 2 shows an operational flow of the test apparatus 100 according to the present embodiment.

FIG. 2 shows an operational flow of the test apparatus 100 according to the present embodiment. The test apparatus 100 tests the plurality of devices under test including optical interfaces, by performing the operational flow from S400 to S440.

First, the test control section 310 executes the test program, and identifies the device under test that is the testing target (S400). The test control section 310 switches the connections of the optical signal supplying sections 230 and/or the first optical switch sections 240 such that electrical signals and/or optical signals are exchanged with this device under test 10.

For example, when testing the opto-electrical converting section 22 of one device under test 10 among the four devices under test 10, the test control section 310 controls the connection of the optical signal supplying sections 230 such that the optical test signal is supplied to the opto-electrical converting section 22 of this device under test 10. Furthermore, when testing the electro-optical converting section 24 of one device under test 10 among the four devices under test 10, the test control section 310 controls the connection of the first optical switch sections 240 such that the optical signal is received from the electro-optical converting section 24 of this device under test 10.

Next, the test control section 310 switches the connections of the second optical switch sections 250 and the third optical switch sections 260 to be connections corresponding to the test that is to be performed (S410). For example when testing the BER of the opto-electrical converting section 22 of the device under test 10, the test control section 310 controls the connections of the second optical switch sections 250 such that the optical test signal from the optical test signal generating section 210 is supplied to the device under test 10 that is the testing target. Furthermore, when testing the BER of the electro-optical converting section 24 of the device under test 10, the test control section 310 controls the connections of the third optical switch sections 260 such that the optical signal output from the device under test 10 that is the testing target from the first optical switch sections 240 is supplied to the optical signal receiving section 270.

The test apparatus 100 may perform loop-back testing to test the opto-electrical converting section 22 of the device under test 10 that is the testing target, using the optical signal output by the electro-optical converting section 24 of the device under test 10 that is the testing target as the optical test signal. In other words, the first optical switch sections 240 receives the optical signal output by one or more of the electro-optical converting sections 24 of the device under test 10 in response to the electrical test signal supplied by the electrical test signal generating section 110 and supplies the received optical signal to the optical signal supplying section 230, and the optical signal supplying section 230 supplies this optical signal to the device under test 10 that is the testing target as the optical test signal.

In this case, the test control section 310 controls the connections of the third optical switch sections 260 such that the optical signal output from one or more of the electro-optical converting sections 24 of the device under test 10 that is the testing target is supplied to the second optical switch section 250. Furthermore, the test control section 310 controls the connections of the second optical switch sections 250 such that the optical signal output by the electro-optical converting section 24 of the device under test 10 that is the testing target is supplied to the corresponding opto-electrical converting section 22 of the device under test 10 that is the testing target.

In this case, the device under test 10 that is the testing target and outputs the optical signal and the device under test 10 that is the testing target and receives the optical signal need not be the same device under test 10. Furthermore, the device under test 10 that is the testing target and outputs the optical signal may be a plurality of different devices under test 10, and the device under test 10 that is the testing target and receives the optical signal may also be a plurality of different devices under test 10.

Next, the test control section 310 causes the electrical test signal to be output from the corresponding electrical test signal generating section 110, according to the test being performed (S420). For example, when testing the BER of an opto-electrical converting section 22 of the device under test 10 that is the testing target, the test control section 310 causes the electrical test signal to be output from the corresponding electrical test signal generating section 110 that is connected to the optical test signal generating section 210, in order to generate the optical test signal from the optical test signal generating section 210. In this way, the optical test signal generating section 210 can supply the device under test 10 that is the testing target with the generated optical test signal.

The test control section 310 may acquire the detection results of the second detecting sections 282 and determine whether the optical test signal supplied to the device under test 10 that is the testing target is normal. The test control section 310 may suspend or stop the testing when it is determined that the optical test signal is not normal.

Instead of this, when the optical test signal is not normal, the test control section 310 may adjust the amplification rate or attenuation rate of the optical intensity changing section 290, for example, to change the intensity of the optical test signal. In this case, if the optical test signal is determined not to be normal even though the intensity of the optical test signal was changed by the optical intensity changing section 290, the test control section 310 may suspend or stop the testing.

When testing the BER of an electro-optical converting section 24 of the device under test 10 that is the testing target, the test control section 310 causes the electrical test signal to be output from the corresponding electrical test signal generating section 110 connected to the electro-optical converting section 24 of this device under test 10 via the electrical interface 120. In this way, the corresponding electrical test signal generating section 110 can supply the device under test 10 that is the testing target with the generated electrical test signal.

When performing a loop-back test of the device under test 10 that is the testing target, the test control section 310 causes the electrical test signal to be output from the electrical test signal generating section 110 connected to the electro-optical converting section 24 of the device under test 10 that is the testing target via the electrical interface 120. In this way, the corresponding electrical test signal generating section 110 can supply the electro-optical converting section 24 that outputs the optical signal with the generated electrical test signal and can supply the device under test 10 that is the testing target with the optical signal output by this electro-optical converting section 24 as the optical test signal.

The test control section 310 may acquire the detection results of the first detecting sections 280 and/or the second detecting sections 282 and determine whether the optical signal output from the device under test 10 that is the testing target is normal. The test control section 310 may suspend or stop the testing when it is determined that the optical signal is not normal.

The test control section 310 then acquires the result of the performed test from the corresponding electrical signal receiving section 130 (S430). Specifically, when testing the BER of an opto-electrical converting section 22 of the device under test 10 that is the testing target, for example, the test control section 310 acquires an analysis result of the electrical signal from the corresponding electrical signal receiving section 130 connected to this opto-electrical converting section 22 via the electrical interface 120.

Furthermore, when testing the BER of an electro-optical converting section 24 of the device under test 10 that is the testing target, the test control section 310 acquires the analysis result of the electrical signal from the electrical signal receiving section 130 connected to this electro-optical converting section 24 via the first optical switch section 240, the third optical switch section 260, and the optical signal receiving section 270. Here, the test control section 310 may acquire the detection results of the first detecting sections 280 and determine whether the optical signal output from the device under test 10 that is the testing target is normal. The test control section 310 may suspend or stop the testing when it is determined that the optical signal is not normal.

When performing a loop-back test of the device under test 10 that is the testing target, the test control section 310 acquires an analysis result of the electrical signal from the corresponding electrical signal receiving section 130 connected to an opto-electrical converting section 22 of the device under test 10 that is the testing target via the electrical interface 120. The test control section 310 may display the acquired analysis result in a display section or may, instead of this or in addition to this, store the acquired analysis result in a storage section, for example.

When there is still testing to be performed according to the test program (S440: NO), the test control section 310 returns to step S400 to identify the device under test that is the testing target, and continues the testing. When all of the testing according to the test program is completed (S440: YES), the test control section 310 ends the testing of the devices under test 10.

In the manner described above, the test apparatus 100 according to the present embodiment can test the plurality of devices under test 10 including optical interfaces. By switching the connections between the devices under test 10 and each test signal generating section and signal receiving section, the test apparatus 100 can supply the test signal to the device under test 10 that is the testing target from among the plurality of devices under test 10 and can acquire a signal from the device under test 10 that is the testing target.

Furthermore, since each section is switched according to the test to be performed, the test apparatus 100 can respectively perform BER testing of an opto-electrical converting section 22, BER testing of an electro-optical converting section 24, or loop-back testing for a device under test 10, for example. Yet further, the test apparatus 100 can perform these tests without exchanging the device under test 10, and can therefore reduce the time and effort required to perform the testing.

The test apparatus 100 includes a plurality of electrical circuits, corresponding to the plurality of devices under test 10, that can be integrated and miniaturized into a single chip, and therefore prevents an increase in complex switching control. Furthermore, in the test apparatus 100, the optical test signal generating section 210, the optical signal receiving section 270, and the like that are difficult to integrate are made to correspond to a plurality of devices under test 10 by switching of the optical signal supplying sections 230, the first optical switch sections 240, and the like, and therefore the cost can be decreased and an increase in circuit size can be prevented.

The test apparatus 100 acquires the detection results of the first detecting sections 280 and/or the second detecting sections 282, and can monitor whether the optical signal is normal during the testing. In this way, when the connection between the test apparatus 100 and a device under test 10 fails during testing or when a problem occurs in a device under test 10 or the test apparatus 100, the test apparatus 100 can immediately suspend or stop the testing, thereby preventing continued testing during incorrect operation.

Figure 3:
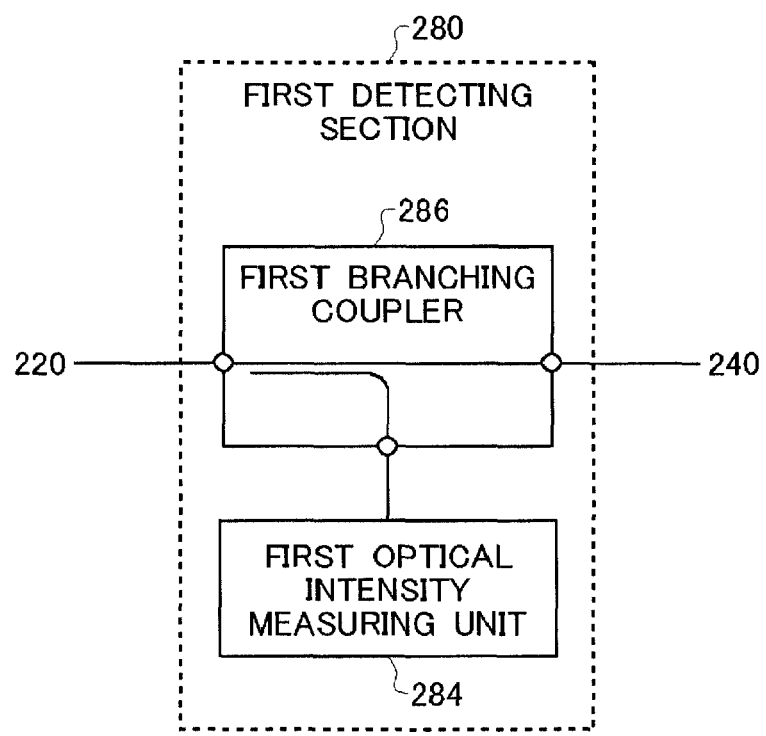
FIG. 3 shows an exemplary configuration of a first detecting section 280 according to the present embodiment.

FIG. 3 shows an exemplary configuration of a first detecting section 280 according to the present embodiment. The first detecting section 280 includes a first optical intensity measuring unit 284 and a first branching coupler 286, and supplies the optical intensity measuring unit with a portion of the optical signal output from the optical interface 220 to measure the intensity of this optical signal.

The first optical intensity measuring unit 284 receives the optical signal using a light receiving device such as a photodiode, and measures the intensity of this optical signal. The first branching coupler 286 has an asymmetrical branching ratio and may prevent a decrease of the signal intensity of the optical signal supplied to the first optical switch section 240. The branching ratio of the first branching coupler 286 is approximately from a ratio of one-to-ten to a ratio of one-to-hundreds, for example. FIG. 3 shows an exemplary configuration of a first detecting section 280 according to the present embodiment, and the second detecting sections 282 may have the same configuration.

Figure 4:
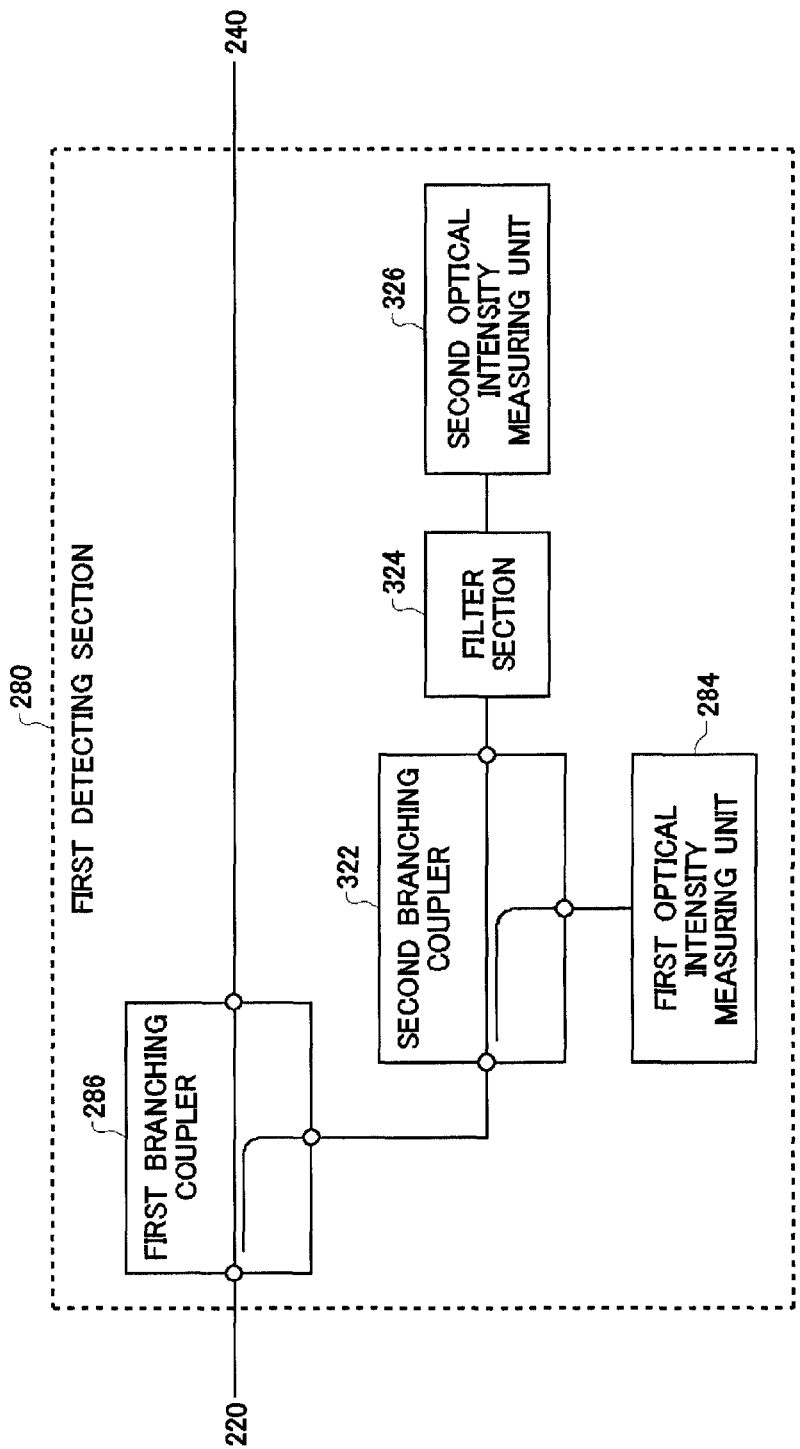
FIG. 4 shows an exemplary modification of the first detecting section 280 according to the present embodiment.

FIG. 4 shows an exemplary modification of the first detecting section 280 according to the present embodiment. In the first detecting section 280 according to the present modification, components that have substantially the same operation as components in the first detecting section 280 according to the present embodiment shown in FIG. 3 are given the same reference numerals, and redundant description is omitted. The first detecting section 280 of the present modification further includes a second branching coupler 322, a filter section 324, and a second optical intensity measuring unit 326.

The second branching coupler 322 is connected to one branch of the first branching coupler 286, and branches the optical signal input thereto from the first branching coupler 286. The second branching coupler 322 performs branching with a one-to-one ratio, for example. The first optical intensity measuring unit 284 measures the intensity of one of the optical signals resulting from the branching by the second branching coupler 322.

The filter section 324 passes an optical signal with a predetermined wavelength band from the other optical signal resulting from the branching of the second branching coupler. The filter section 324 may be a high-pass filter that passes an optical signal with a broad wavelength region that includes the predetermined wavelength band, or may instead be a low-pass filter that passes an optical signal with a narrow wavelength region that includes the predetermined wavelength band. The filter section 324 is preferably a band-pass filter that passes the predetermined wavelength band.

The second optical intensity measuring unit 326 measures the intensity of the optical signal passed by the filter section 324. In this way, the second optical intensity measuring unit 326 measures the intensity of the signal with the predetermined wavelength band, within the optical signal input to the first detecting section 280. In other words, in the first detecting section 280 of the present modification, the first optical intensity measuring unit 284 measures the optical intensity of the input optical signal and the second optical intensity measuring unit 326 measures the wavelength band of this optical signal.

In this way, the first detecting section 280 of the present modification can measure both the intensity and the light emission frequency band of the optical signal output by the device under test 10. Specifically, the test apparatus 100 can measure the optical intensity and the optical frequency band of the optical signals exchanged with the device under test 10, without switching the connection to a photometric unit or the like. The second detecting sections 282 may each have the same configuration as the first detecting section 280 of the present modification.

Figure 5:
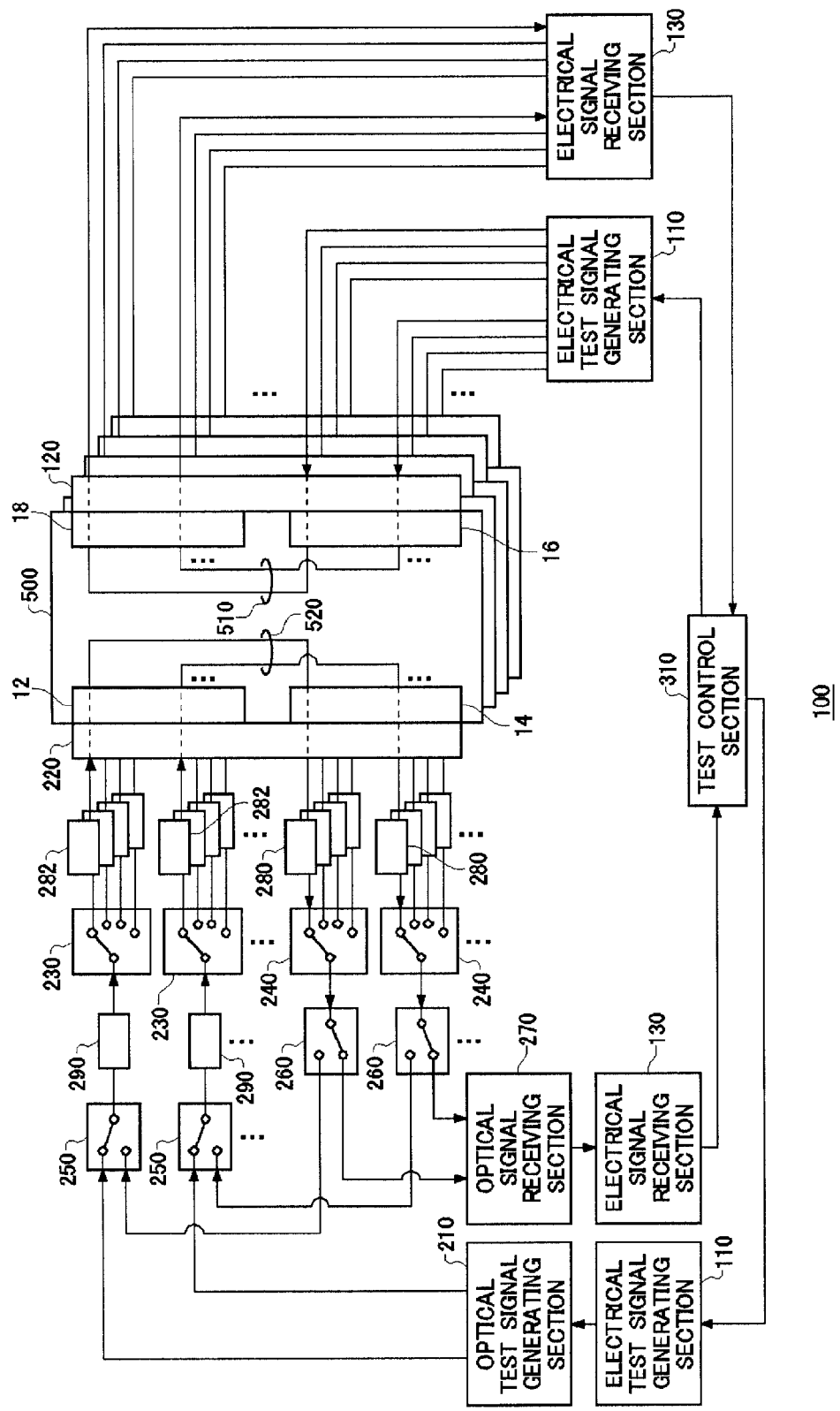
FIG. 5 shows an exemplary configuration of a calibration device 500 that performs calibration of the test apparatus 100 according to the present embodiment, along with this test apparatus 100.

FIG. 5 shows an exemplary configuration of a calibration device 500 that performs calibration of the test apparatus 100 according to the present embodiment, along with this test apparatus 100. The test apparatus 100 of FIG. 5 is substantially the same as the test apparatus 100 according to the present embodiment shown in FIG. 1, and redundant description is omitted. The calibration device 500 includes an electrical signal transmitting section 510 and an optical signal transmitting section 520.

The electrical signal transmitting section 510 receives the electrical test signal supplied from the electrical test signal generating section 110 via the electrical interface 120 and transmits this electrical test signal to the electrical signal receiving section 130 via the electrical interface 120. Specifically, the electrical signal transmitting section 510 is an electrical signal through-wire that is electrically connected within the calibration device 500 from the electrical signal input section connected to the electrical test signal generating section 110 to the electrical signal output section connected to the electrical signal receiving section 130, and transmits the electrical signal input thereto, for example.

In this way, the electrical signal transmitting section 510 transmits the electrical test signal supplied by the electrical test signal generating section 110 to the electrical signal receiving section 130, and therefore the test apparatus 100 can perform calibration for the transmission and reception of the electrical test signal, according to the received electrical test signal. For example, the test apparatus 100 adjusts the supply timing of the electrical test signal supplied to the device under test 10 and/or the acquisition timing of the electrical signal from the device under test 10.

Furthermore, by calculating the transmission loss of the transmission path based on the signal intensity ratio between the supplied electrical test signal and the received electrical test signal, the test apparatus 100 may set the signal intensity of the electrical test signal to be supplied by the electrical test signal generating section 110. When this transmission loss is greater than or equal to a predetermined value, the test apparatus 100 may determine that there is an abnormality in the electrical connection between the test apparatus 100 and the calibration device 500.

In this case, the test apparatus 100 may redo the electrical connection between the electrical interface 120 and the calibration device 500. In a case where this electrical connection has been made at least a predetermined number of times but abnormal transmission loss is still detected, the test apparatus 100 may determine that there is an abnormality in the electrical interface 120.

The optical signal transmitting section 520 receives the optical test signal supplied from the optical test signal generating section 210 via the optical signal supplying section 230, and transmits this optical signal to the optical signal receiving section 270 via the first optical switch section 240. In other words, the optical signal transmitting section 520 is an optical signal through-waveguide that is connected within the calibration device 500 from the optical signal input section connected to the optical test signal generating section 210 to an optical signal output section connected to the optical signal receiving section 270, and transmits the optical signal input thereto.

In this way, in the same manner as the electrical signal transmitting section 510, the optical signal transmitting section 520 transmits the optical test signal supplied by the optical test signal generating section 210 to the optical signal receiving section 270, and therefore the test apparatus 100 can perform calibration for the transmission and reception of the optical test signal, according to the received optical test signal. For example, the test apparatus 100 adjusts the supply timing and/or acquisition timing of the optical test signal. Furthermore, the test apparatus 100 may set the optical signal intensity of the optical test signal to be supplied by the optical test signal generating section 210 and/or the optical intensity to which the optical intensity changing section 290 is to change the intensity of the optical test signal.

In the same manner as when detecting an abnormality in the electrical connection, the test apparatus 100 may detect an abnormality in the optical connection between the test apparatus 100 and the calibration device 500. In this way, by using the calibration device 500, the test apparatus 100 can determine pass/fail of the connection state of the electrical interface and the optical interface.

As described above, by including through-wires that respectively transmit electrical signals and optical signals from the input section to the output section, the calibration device 500 of the present embodiment can perform calibration of the test apparatus 100. The calibration device 500 may correspond to one of the devices under test 10 and be formed to have substantially the same shape as this device under test 10. In this case, the test apparatus 100 may sequentially perform calibration of each interface connected to each device under test 10 by being sequentially connecting the calibration device 500 thereto.

A plurality of the calibration devices 500 may be connected to the test apparatus 100. In this case, the test apparatus 100 can perform calibration in parallel. FIG. 5 shows an example in which the test apparatus 100 is connected to four calibration devices 500 having substantially the same shape as one device under test 10. Instead, a calibration device 500 may correspond to a plurality of devices under test 10 and be formed to have substantially the same shape as the shape resulting from the combination of these devices under test 10.

The test apparatus 100 of the present embodiment described above can test and acquire the BER of the electrical signal received by causing the device under test 10 to generate an electrical signal, the BER of the optical signal received by causing the device under test 10 to generate an optical signal, the BER of a loop-back test in which the device under test 10 generates an optical signal and then receives this optical signal, and the like. Furthermore, the test apparatus 100 can detect the signals being exchanged with the device under test 10 and determine whether these signals are abnormal. The test apparatus 100 determines a signal to be abnormal if the signal intensity of the signal, the supply timing of the signal, and/or the acquisition timing of the signal are outside of a predetermined range, for example.

When an exchanged signal is detected to be abnormal, the test apparatus 100 may analyze the cause of this abnormality. For example, when performing a loop-back test, the test apparatus 100 analyzes the cause of the abnormality in response to detecting an abnormality in the electrical signal received by the electrical signal receiving section 130. When there is an abnormality in the electrical signal output from one of the plurality of opto-electrical converting sections 22, the test apparatus 100 supplies this opto-electrical converting section 22 with an optical test signal that is an optical signal obtained from the conversion of the optical signal performed by an electro-optical converting section 24 other than the electro-optical converting section 24 that supplied this opto-electrical converting section 22 with this abnormal optical signal.

In this way, when an abnormality is detected in the loop-back test result output from one opto-electrical converting section 22, the test apparatus 100 switches the first optical switch section 240 and changes the electro-optical converting section 24 that supplies the optical signal to this one opto-electrical converting section 22. The test apparatus 100 then receives the electrical signal resulting from the conversion by this one opto-electrical converting section 22 and determines the cause of the abnormality, in response to the optical test signal supplied from the electro-optical converting section 24 used after the change. For example, when changing the electro-optical converting section 24 results in the received electrical signal being in a normal state, the test apparatus 100 determines that there is an error in the electro-optical converting section 24 that was used before the change.

In a case where the electrical signal continues to be abnormal even when the electro-optical converting section 24 is changed, the test apparatus 100 determines that either the electro-optical converting section 24 used before the change was normal or that there is an abnormality in both the electro-optical converting section 24 used before the change and the electro-optical converting section 24 used after the change. In this case, the test apparatus 100 may supply the optical signal resulting from the conversion performed by the electro-optical converting section 24 used before the change or by the electro-optical converting section 24 used after the change to an opto-electrical converting section 22 other than the one opto-electrical converting section 22. In this way, when there is an abnormality in the loop-back test result output from the one opto-electrical converting section 22, the test apparatus 100 may switch the optical signal supplying section 230 to change the opto-electrical converting section 22 that receives the optical test signal from the electro-optical converting section 24.

In a case where the changing of the opto-electrical converting section 22 results in the received electrical signal being in a normal state, for example, the test apparatus 100 determines that there is an abnormality in the opto-electrical converting section 22 used before the change. Furthermore, if almost no change in the abnormality of the electrical signal is detected even when both the electro-optical converting section 24 and the opto-electrical converting section 22 are changed, the test apparatus 100 may determine that there is an abnormality in both the electro-optical converting section 24 and the opto-electrical converting section 22 used in the testing. In this case, the test apparatus 100 may sequentially change the opto-electrical converting section 22 and/or the electro-optical converting section 24 until a normal state is detected.

When a normal state is detected in response to changing the opto-electrical converting section 22 and/or the electro-optical converting section 24, the test apparatus 100 determines that the combination of the opto-electrical converting section 22 and the electro-optical converting section 24 used after the change is normal. The test apparatus 100 may then determine whether the other converting sections are abnormal, using the normal opto-electrical converting section 22 or electro-optical converting section 24. In a case where a normal state is not detected even after sequentially performing a predetermined number of changes, the test apparatus 100 may determine this device under test 10 to be a fail.

Instead of or in addition to this, when performing the loop-back test, the test apparatus 100 may analyze the cause of the abnormality according to the detection results of the first detecting sections 280 and/or the second detecting sections 282. The test apparatus 100 can detect the optical intensity of the optical signal output from an electro-optical converting section 24 using the first detecting sections 280 and/or the second detecting sections 282, and can therefore analyze whether there is an abnormality in the optical signal intensity from this opto-electrical converting section 22.

Furthermore, the test apparatus 100 may switch the optical signal output from the electro-optical converting section 24 to be input to the optical signal receiving section 270, in response to detecting an abnormality in the received electrical signal. By switching the first optical switch section 240, the test apparatus 100 can receive the optical signal resulting from the conversion by the electro-optical converting section 24 with the optical signal receiving section 270 and analyze this optical signal. In this way, the test apparatus 100 can determine whether there is an abnormality in the electro-optical converting section 24.

When it is determined that one electro-optical converting section 24 is outputting a normal optical signal, the test apparatus 100 may supply the optical signal output by this one electro-optical converting section 24 to an opto-electrical converting section 22 that is to be analyzed. In this way, the test apparatus 100 can determine whether there is an abnormality in the opto-electrical converting section 22.

The test apparatus 100 according to the present embodiment can determine pass/fail of the connection state of the electrical interfaces and the optical interfaces of the test apparatus 100 and the devices under test 10, using the calibration device 500. Accordingly, by combining the calibration with the calibration device 500 and the performance of each test by the test apparatus 100 according to the present embodiment described above, it is possible to separately determine pass/fail of the connection state of the interfaces and pass/fail of the devices under test.

The present embodiment describes an example in which the test apparatus 100 performs a loop-back test, a BER test of the optical signal generated by the device under test 10, and a BER test of the electrical signal generated by the device under test 10. Instead, the test apparatus 100 may perform a test to determine pass/fail of a device under test 10 by supplying a test signal to the device under test 10, receiving a response signal output from the device under test 10, and comparing this response signal to an expected value corresponding to the test signal.

For example, the test control section 310 causes an optical test signal corresponding to a test program to be output from the optical test signal generating section 210, supplies this optical signal to the device under test 10 that is the testing target, and generates an expected value for the response signal to be output from the device under test 10 in response to this optical test signal. The optical signal receiving section 270 receives the optical response signal output by the device under test 10 that is the testing target in response to the optical test signal, converts this optical response signal into an electrical signal, and supplies the resulting electrical signal to the test control section 310. The test control section 310 can compare the converted response signal to the generated expected value to determine pass/fail of the device under test 10 that is the testing target. In this way, the test apparatus 100 can perform a pass/fail test for a plurality of devices under test that output optical signals in response to the input of optical signals.

In a case where the device under test 10 that is the testing target outputs an electrical response signal in response to the optical test signal, the electrical signal receiving section 130 may receive this electrical response signal through the electrical interface 120. The test control section 310 can compare the electrical response signal received by the electrical signal receiving section 130 to the generated expected value to determine pass/fail of the device under test 10 that is the testing target. In this way, the test apparatus 100 can perform a pass/fail test for a plurality of devices under test that output electrical signals in response to the input of optical signals.

In a case where the device under test 10 that is the testing target outputs an optical response signal in response to an electrical test signal, the test control section 310 may cause an electrical test signal to be generated from the electrical test signal generating section 110 and supplied to the device under test 10 that is the testing target. The optical signal receiving section 270 receives the optical response signal output by the device under test 10 that is the testing target in response to the electrical test signal, converts the optical response signal into an electrical signal, and supplies the resulting electrical signal to the test control section 310. The test control section 310 can compare the converted response signal to the generated expected value to determine pass/fail of the device under test 10 that is the testing target. In this way, the test apparatus 100 can perform a pass/fail test for a plurality of devices under test that output optical signals in response to the input of electrical signals.

In this way, the test apparatus 100 according to the present embodiment can respectively supply optical test signals and/or electrical test signals to a plurality of devices under test 10 having optical interfaces, and can perform various tests by receiving optical response signals and/or electrical response signals output by these devices under test 10. The test apparatus 100 can perform tests according to a test program on a device under test 10 that is the testing target, without exchanging the device under test 10.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus comprising:
   an optical test signal generating section that generates an optical test signal;
   an optical signal supplying section that supplies the optical test signal to a device under test that is a testing target among a plurality of the devices under test;
   a first optical switch section that selects, from among the plurality of devices under test, the device under test that is the testing target; and
   an optical signal receiving section that receives an optical signal output by the device under test that is the testing target,
   an electrical test signal generating section that generates an electrical test signal for testing the plurality of devices under test;
   an electrical interface that supplies the electrical test signal to each of the devices under test, receives electrical signals output by the devices under test, and outputs each of the received electrical signals; and
   an electrical signal receiving section that receives the electrical signals, wherein
   the test apparatus tests one of the devices under test that includes a plurality of opto-electrical converting sections that convert optical signals into electrical signals and a plurality of electro-optical converting sections that convert electrical signals into optical signals,
   the first optical switch section receives the optical signal output by one or more of the electro-optical converting sections of the device under test in response to the electrical test signal generated by the electrical test signal generating section, and supplies the received optical signal to the optical signal supplying section, and the optical signal supplying section supplies the device under test that is the testing target with the received optical signal, as the optical test signal.

2. The test apparatus according to claim 1, comprising:
a second optical switch section that switches which one of the optical test signal and the optical signal output by the device under test that is the testing target from the first optical switch section is supplied to the device under test that is the testing target.

3. The test apparatus according to claim 2; comprising:
a third optical switch section that switches which one of the optical signal receiving section and the second optical switch section the optical signal output by the device under test that is the testing target from the first optical switch section is supplied to.

4. The test apparatus according to claim 1, comprising:
a first detecting section that detects optical intensity of each of the optical signals output by the plurality of devices under test.

5. The test apparatus according to claim 4, wherein the first detecting section includes:
a branching coupler that branches an optical signal input thereto;
a first optical intensity measuring section that measures intensity of one of the optical signals resulting from the branching by the branching coupler;
a filter section that passes an optical signal with a predetermined wavelength band in the other of the optical signals resulting from the branching by the branching coupler; and
a second optical intensity measuring section that measures intensity of the optical signal passed by the filter section.

6. The test apparatus according to claim 1, comprising:
a second detecting section that detects optical intensity of the optical signal output from the optical signal supplying section.

7. The test apparatus according to claim 1, further comprising:
an optical intensity changing section that changes optical intensity of the optical signal output from the optical signal supplying section.

8. The test apparatus according to claim 1, wherein
the optical signal supplying section includes an optical switch that selects the device under test that is the testing target from among the plurality of devices under test, and inputs the optical test signal output by the optical test signal generating section.

9. The test apparatus according to claim 1, wherein
the optical signal supplying section includes an optical coupler that branches the optical test signal output by the optical test signal generating section and inputs the resulting branched optical test signal to the device under test that is the testing target.

10. A calibration device that calibrates the test apparatus according to claim 1, comprising:
an electrical signal transmitting section that receives the electrical test signal supplied from the electrical test signal generating section via the electrical interface, and transmits the received electrical test signal to the electrical signal receiving section via the electrical interface; and an optical signal transmitting section that receives the optical test signal supplied from the optical test signal generating section via the optical signal supplying section, and transmits the received optical test signal to the optical signal receiving section via the first optical switch section.

11. A calibration method for calibrating the test apparatus with the calibration device according to claim 10, comprising:
transmitting the electrical test signal supplied from the electrical test signal generating section to the electrical signal receiving section via the calibration device; and
transmitting the optical test signal supplied from the optical test signal generating section to the optical signal receiving section via the calibration device.

12. A method comprising:
generating, by an optical test signal generating section, an optical test signal;
supplying, by an optical signal supplying section, the optical test signal to a device under test that is a testing target among a plurality of the devices under test;
selecting, by a first optical switch, from among the plurality of devices under test, the device under test that is the testing target;
receiving, by an optical signal receiving section, an optical signal output by the device under test that is the testing target;
switching, by a second optical switch, which one of the optical test signal and the optical signal output by the device under test that is the testing target from the first optical switch section is supplied to the device under test that is the testing target,
switching, by a third optical switch, which one of the optical signal receiving section and the second optical switch the optical signal output by the device under test that is the testing target from the first optical switch is supplied to.

13. A method comprising:
generating, by an electrical test signal generating section, an electrical test signal for testing a device under test includes a plurality of opto-electrical converting sections that convert optical signals into electrical signals and a plurality of electro-optical converting sections that convert electrical signals into optical signals;
receiving, by an optical signal receiving section, the optical signal output by one or more of the electro-optical converting sections of the device under test in response to the electrical test signal;
supplying by an optical signal supplying section, the device under test with the received optical signal, as an optical test signal; and
receiving, by an electrical signal receiving section, an electrical signal output by an opto-electrical converting section of the device under test in response to the optical test signal.

14. The test method according to claim 13 comprising, when an abnormality is detected in the electrical signal output from one of the opto-electrical converting sections among the plurality of opto-electrical converting section during the electrical signal reception:
second optical signal supply of supplying the one opto-electrical converting section with the optical test signal that is an optical signal that has been converted by an electro-optical converting section differing from the electro-optical converting section that supplied the optical signal to the one opto-electrical converting section during the first optical signal supply; and abnormality determination of receiving an electrical signal that has been converted by the one opto-electrical converting section in response to the optical test signal supplied during the second optical signal supply, and determining a cause of the abnormality.

15. The test method according to claim 13, further comprising:
optical signal switching of switching the optical signal output during the first optical signal supply to be input to an optical signal receiving section, in response to an abnormality being detected in the electrical signal received during the electrical signal reception.

16. A method comprising:
generating, by an optical test signal generating section, an optical test signal;
supplying, by an optical signal supplying section, the optical test signal to a device under test that is a testing target among a plurality of the devices under test;
selecting, by a first optical switch, from among the plurality of devices under test, the device under test that is the testing target;
receiving, by an optical signal receiving section, an optical signal output by the device under test that is the testing target; and
detecting, by a first detecting section, optical intensity of each of the optical signals output by the plurality of devices under test, wherein the detecting includes:
branching, by a branching coupler, an optical signal input thereto;
measuring, by a first optical intensity measuring section, intensity of one of the optical signals resulting from the branching by the branching coupler;
passing, by a filter section, an optical signal with a predetermined wavelength band in the other of the optical signals resulting from the branching by the branching coupler; and
measuring, by a second optical intensity measuring section, intensity of the optical signal passed by the filter section.

* * * * *